United States Patent
Peng et al.

(10) Patent No.: US 11,360,519 B2
(45) Date of Patent: Jun. 14, 2022

(54) ELECTRONIC DEVICE

(71) Applicants: Ming-Chung Peng, Taipei (TW); Jih-Houng Lee, Taipei (TW); Ko-Fan Chen, Taipei (TW); Hsin-Yu Huang, Taipei (TW)

(72) Inventors: Ming-Chung Peng, Taipei (TW); Jih-Houng Lee, Taipei (TW); Ko-Fan Chen, Taipei (TW); Hsin-Yu Huang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/782,078

(22) Filed: Feb. 5, 2020

(65) Prior Publication Data

US 2020/0387196 A1    Dec. 10, 2020

Related U.S. Application Data

(60) Provisional application No. 62/938,225, filed on Nov. 20, 2019, provisional application No. 62/857,250, filed on Jun. 4, 2019.

(51) Int. Cl.
  *G06F 1/16* (2006.01)
  *H05K 7/14* (2006.01)
  *H05K 5/03* (2006.01)

(52) U.S. Cl.
  CPC .......... *G06F 1/1656* (2013.01); *G06F 1/1616* (2013.01); *G06F 1/1637* (2013.01); *G06F 1/1681* (2013.01); *H05K 5/03* (2013.01); *H05K 7/1427* (2013.01)

(58) Field of Classification Search
  CPC .... G06F 1/1656; G06F 1/1681; G06F 1/1637; G06F 1/1616; H05K 5/03; H05K 7/1427
  See application file for complete search history.

(56) References Cited

U.S. PATENT DOCUMENTS

| | | | | |
|---|---|---|---|---|
| 5,796,576 A | * | 8/1998 | Kim | G06F 1/1616 361/679.28 |
| 6,785,935 B2 | * | 9/2004 | Ahn | H04M 1/0216 16/221 |
| 7,016,183 B2 | * | 3/2006 | Takemoto | G06F 1/162 312/223.2 |

(Continued)

FOREIGN PATENT DOCUMENTS

| | | |
|---|---|---|
| CN | 101339718 | 1/2009 |
| CN | 205862269 | 1/2017 |

(Continued)

OTHER PUBLICATIONS

"Office Action of Taiwan Counterpart Application", dated Apr. 27, 2021, p. 1-p. 8.

*Primary Examiner* — Anthony M Haughton
*Assistant Examiner* — Theron S Milliser
(74) *Attorney, Agent, or Firm* — JCIPRNET

(57) ABSTRACT

An electronic device includes a first body, a second body, at least one hinge, and at least one electronic assembly. The hinge is connected between the first body and the second body, and the first body and the second body are adapted to rotate relatively through the hinge. The electronic assembly is connected to the second body. A first gap exists between the electronic assembly and the hinge in an axial direction of the hinge.

30 Claims, 11 Drawing Sheets

(56) References Cited

U.S. PATENT DOCUMENTS

| | | | | |
|---|---|---|---|---|
| 7,463,481 | B2* | 12/2008 | Lev | G06F 1/162 248/921 |
| 8,405,978 | B2* | 3/2013 | Okutsu | G06F 1/1616 361/679.55 |
| 10,635,141 | B2* | 4/2020 | Silvanto | E05D 11/0081 |
| 2004/0056977 | A1* | 3/2004 | Kim | H04N 5/2251 348/376 |
| 2004/0107537 | A1* | 6/2004 | Ahn | H04M 1/0216 16/221 |
| 2004/0203535 | A1* | 10/2004 | Kim | H04M 1/0264 455/90.3 |
| 2004/0266239 | A1* | 12/2004 | Kurokawa | G06F 1/1656 439/165 |
| 2005/0050686 | A1* | 3/2005 | Kurokawa | G06F 1/1681 16/354 |
| 2005/0094025 | A1* | 5/2005 | Yoon | H04M 1/0264 348/360 |
| 2005/0140812 | A1* | 6/2005 | Yoo | H04B 1/38 348/333.06 |
| 2005/0272462 | A1* | 12/2005 | Okamoto | G06F 1/3259 455/550.1 |
| 2006/0033832 | A1* | 2/2006 | Shin | H05K 1/028 348/335 |
| 2014/0307380 | A1* | 10/2014 | Nakamura | G06F 1/1683 361/679.27 |
| 2018/0113493 | A1* | 4/2018 | Silvanto | E05D 11/0054 |

FOREIGN PATENT DOCUMENTS

| | | |
|---|---|---|
| CN | 207571638 | 7/2018 |
| TW | I332152 | 10/2010 |

\* cited by examiner

ELECTRONIC DEVICE

CROSS-REFERENCE TO RELATED APPLICATION

This application claims the benefit of U.S. provisional application Ser. No. 62/857,250, filed on Jun. 4, 2019 and No. 62/938,225, filed on Nov. 20, 2019. The entirety of each of the above-mentioned patent applications is hereby incorporated by reference herein and made a part of this specification.

BACKGROUND

Technical Field

The disclosure relates to an electronic device, and in particular, to an electronic device including a plurality of bodies.

Description of Related Art

Notebook computers (NB) have been popular in the consumers' market for a long time. A screen of an NB includes a display panel, and an end of the display panel is usually connected to a control board. Most control boards are extended toward a rear end of the NB along a direction parallel to a display surface, and therefore, a width of the NB in this direction is increased. To resolve the problem, the control boards of some NBs are folded back to overlap the back of the display panel. However, this increases the overall thickness of the NB.

SUMMARY

The disclosure provides an electronic device having a relatively small overall size.

An electronic device provided in an embodiment of the disclosure includes a first body, a second body, at least one hinge, and at least one electronic assembly. The hinge is connected between the first body and the second body, and the first body and the second body are adapted to rotate relatively through the hinge. The electronic assembly is connected to the second body. A first gap exists between the electronic assembly and the hinge in an axial direction of the hinge.

In an embodiment of the disclosure, the first gap is less than or equal to one half a length of the at least one hinge along the axial direction.

In an embodiment of the disclosure, the first gap is less than or equal to 2 mm.

In an embodiment of the disclosure, a quantity of the at least one hinge is one, a quantity of the at least one electronic assembly is two, and the hinge is located between the two electronic assemblies.

In an embodiment of the disclosure, a quantity of the at least one hinge is two, a quantity of the at least one electronic assembly is one, and one hinge is located between the electronic assembly and the other hinge.

In an embodiment of the disclosure, a quantity of the at least one hinge is two, a quantity of the at least one electronic assembly is one, and the electronic assembly is located between the two hinges.

In an embodiment of the disclosure, a quantity of the at least one hinge is two, a quantity of the at least one electronic assembly is two, and the two hinges are located between the two electronic assemblies.

In an embodiment of the disclosure, the at least one electronic assembly and the at least one hinge do not overlap in the axial direction.

In an embodiment of the disclosure, a second gap exists between the at least one electronic assembly and the at least one hinge in a radial direction of the at least one hinge.

In an embodiment of the disclosure, the second body includes a display panel.

In an embodiment of the disclosure, the at least one electronic assembly includes a control circuit board and a flexible printed circuit (FPC), and two ends of the FPC are respectively connected to the control circuit board and the display panel.

In an embodiment of the disclosure, an angle between an extension direction of the control circuit board and an extension direction of the display panel is 45 degrees to 100 degrees.

In an embodiment of the disclosure, the second body includes a lock assembly, connected to the display panel, and the control circuit board is locked to the lock assembly.

In an embodiment of the disclosure, a region between the two ends of the FPC is separated from the control circuit board.

In an embodiment of the disclosure, the control circuit board bends relative to the display panel through single bending of the FPC.

In an embodiment of the disclosure, the control circuit board includes a top edge and a bottom edge, the top edge is close to the display panel, and the bottom edge is away from the display panel.

In an embodiment of the disclosure, the FPC is connected to the display panel from the control circuit board through the top edge.

In an embodiment of the disclosure, an extension length of the FPC from the display panel to the control circuit board is less than or equal to an extension length of the control circuit board along a direction away from the FPC.

In an embodiment of the disclosure, each side edge of the control circuit board is a flat surface.

In an embodiment of the disclosure, the control circuit board includes a through hole, and the FPC does not penetrate the through hole.

In an embodiment of the disclosure, the second body includes a back cover and a front frame, and the display panel is disposed between the back cover and the front frame and is exposed by the front frame.

In an embodiment of the disclosure, the control circuit board is secured to the front frame.

In an embodiment of the disclosure, the front frame includes a main housing and a hinge cover, and the hinge cover is connected to the main housing.

In an embodiment of the disclosure, the control circuit board is attached to or engaged with the main housing.

In an embodiment of the disclosure, the control circuit board is attached to or engaged with the hinge cover.

In an embodiment of the disclosure, the second body includes a receiving groove, configured to receive the control circuit board, the FPC, and the at least one hinge.

In an embodiment of the disclosure, an end of the display panel extends into the receiving groove.

In an embodiment of the disclosure, the first body is a logic unit or a stand.

In an embodiment of the disclosure, the at least one electronic assembly includes at least one of a button, an antenna, a speaker, a camera lens, and a gesture sensor.

An electronic device provided in another embodiment of the disclosure includes a first body, a second body, at least one hinge, and at least one electronic assembly. The at least one hinge is connected between the first body and the second body, where the first body and the second body are adapted to rotate relatively through the at least one hinge. The at least one electronic assembly is connected to the second body, where a second gap exists between the at least one electronic assembly and the at least one hinge in an axial direction of the at least one hinge.

In an embodiment of the disclosure, the second gap is less than or equal to a diameter of the at least one hinge.

In an embodiment of the disclosure, the second gap is less than or equal to 4 mm.

Based on the above, in the electronic device of the disclosure, a gap (i.e., the first gap) exists between the electronic assembly and the hinge in the axial direction. In this way, the electronic assembly may smoothly bend relative to the second body without causing interference with the hinge, so that electronic assembly does not increase the overall size of the electronic device in the direction parallel to the display surface of the second body.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
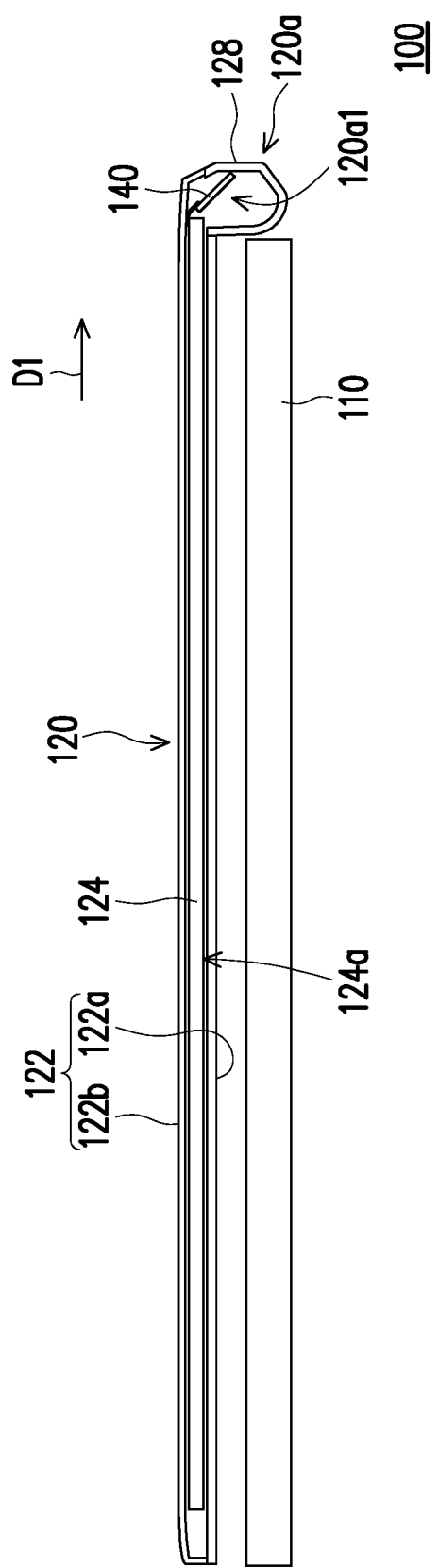
FIG. 1 is a schematic cross-sectional view of some components of an electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
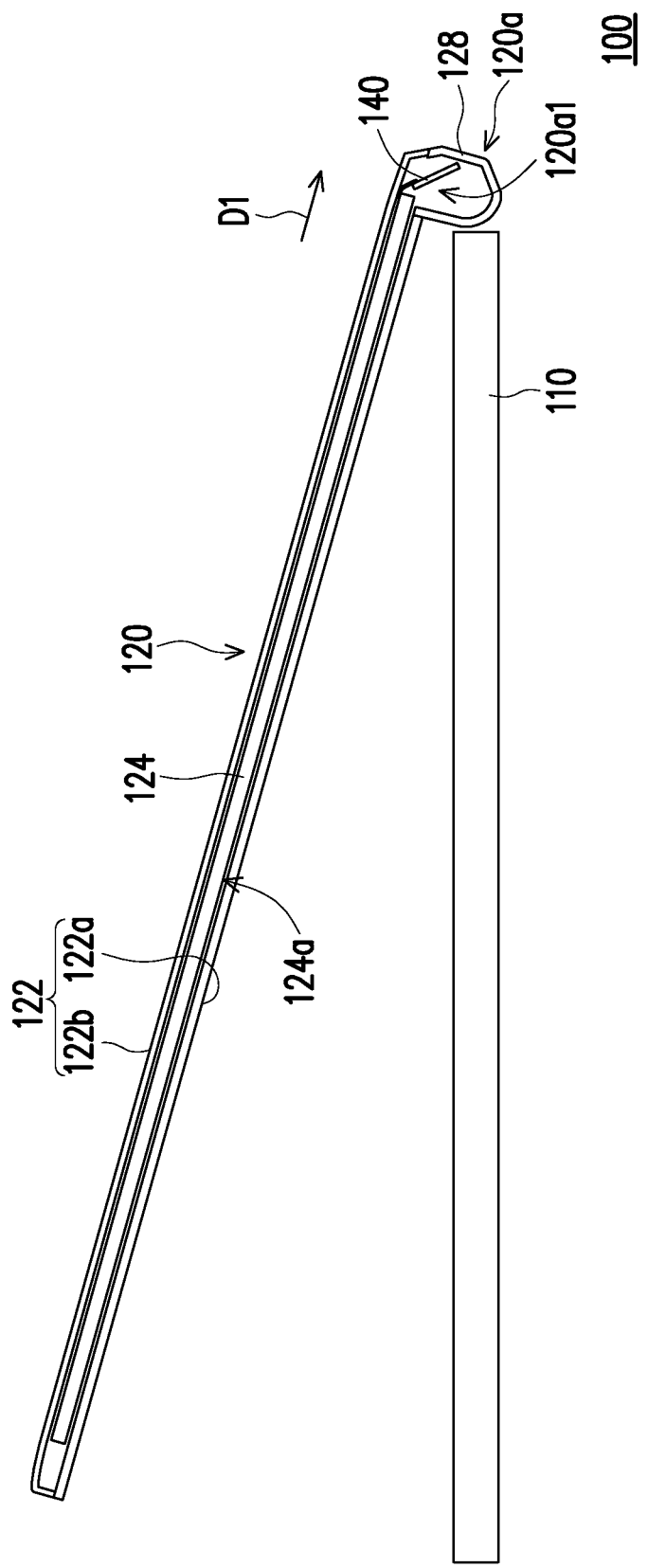
FIG. 2 illustrates that a first body and a second body in FIG. 1 relatively rotate.

FIG. 1 is a schematic cross-sectional view of some components of an electronic device according to an embodiment of the disclosure. FIG. 2 illustrates that a first body and a second body in FIG. 1 relatively rotate. Referring to FIG. 1 and FIG. 2, an electronic device 100 in the present embodiment is, for example, an NB and includes a first body 110 and a second body 120. The first body 110 is, for example, a host (i.e., a logic unit) of the NB. The second body 120 is, for example, a screen of the NB and includes a main housing 122 and a display panel 124. The main housing 122 includes a front frame 122a and a back cover 122b. The display panel 124 is disposed in the main housing 122, is located between the front frame 122a and the back cover 122b, and is exposed by the front frame 122a. As shown in FIG. 2, the second body 120 may be expanded relative to the first body 110. In other embodiments, the electronic device 100 may be alternatively a tablet computer, and in this case, the first body 110 is, for example, a stand of the tablet computer.

Figure 3:
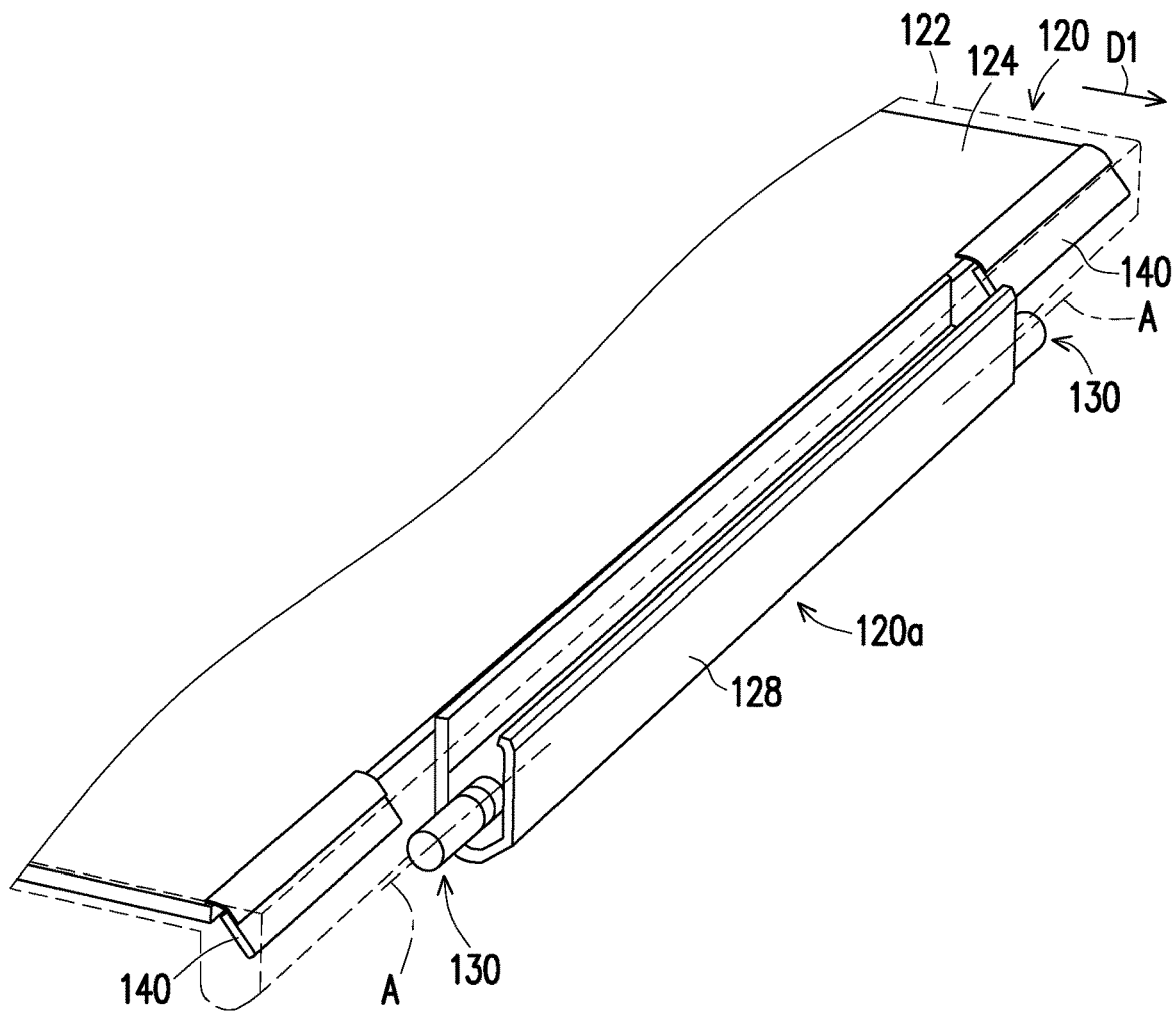
FIG. 3 is a three-dimensional view of some components of the electronic device in FIG. 1.

FIG. 3 is a three-dimensional view of some components of the electronic device in FIG. 1. Referring to FIG. 3, the electronic device 100 in the present embodiment further includes two hinges 130 and two electronic assemblies 140. The two hinges 130 are connected between the first body 110 (shown in FIG. 1) and the main housing 122 (shown in FIG. 1) of the second body 120. The first body 110 and the second body 120 are adapted to rotate relatively through the two hinges 130, so that the second body 120 is expanded as described above. The electronic assembly 140 is connected to the second body 120.

Figure 4:
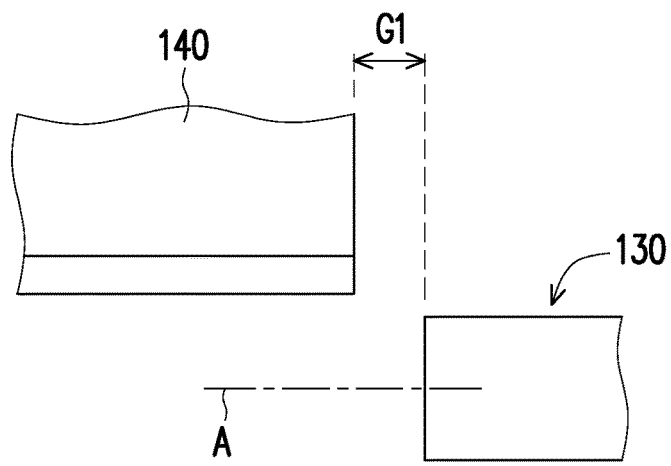
FIG. 4 is a schematic rear view of a hinge and an electronic assembly in FIG. 3.

FIG. 4 is a schematic rear view of a hinge and an electronic assembly in FIG. 3. Referring to FIG. 3 and FIG. 4, the two hinges 130 are located between the two electronic assemblies 140, and a first gap G1 (shown in FIG. 4) exists between each electronic assembly 140 and an adjacent hinge 130 in an axial direction A of the hinge 130. In this way, the electronic assembly 140 can smoothly bend relative to the second body 120 without causing interference with the hinge A, so that the electronic assembly 140 does not increase an overall size of the electronic device 100 in a direction D1 (shown in FIG. 1 to FIG. 3) parallel to a display surface 124a of the second body 120. For example, the first gap G1 is less than or equal to one half a length of the hinge 130 along the axial direction A, to reduce a size of the electronic device 100 in the axial direction A. Specifically, the first gap G1 is, for example, less than or equal to 2 mm.

Figure 5A:
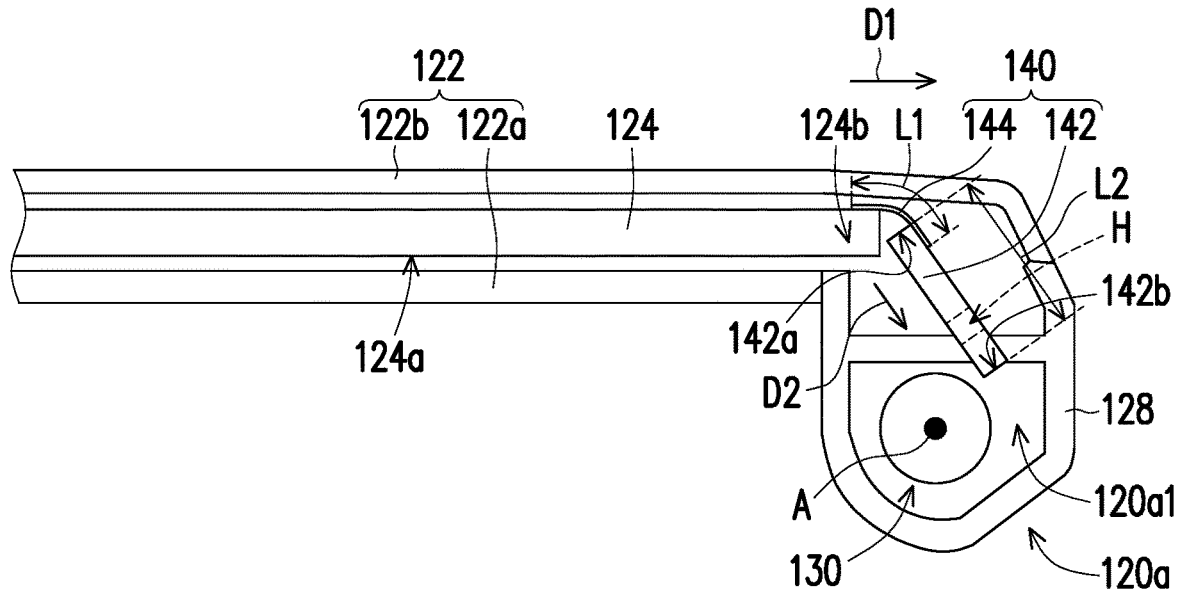
FIG. 5A is a partial cross-sectional view of the electronic device in FIG. 1.
Figure 5B:
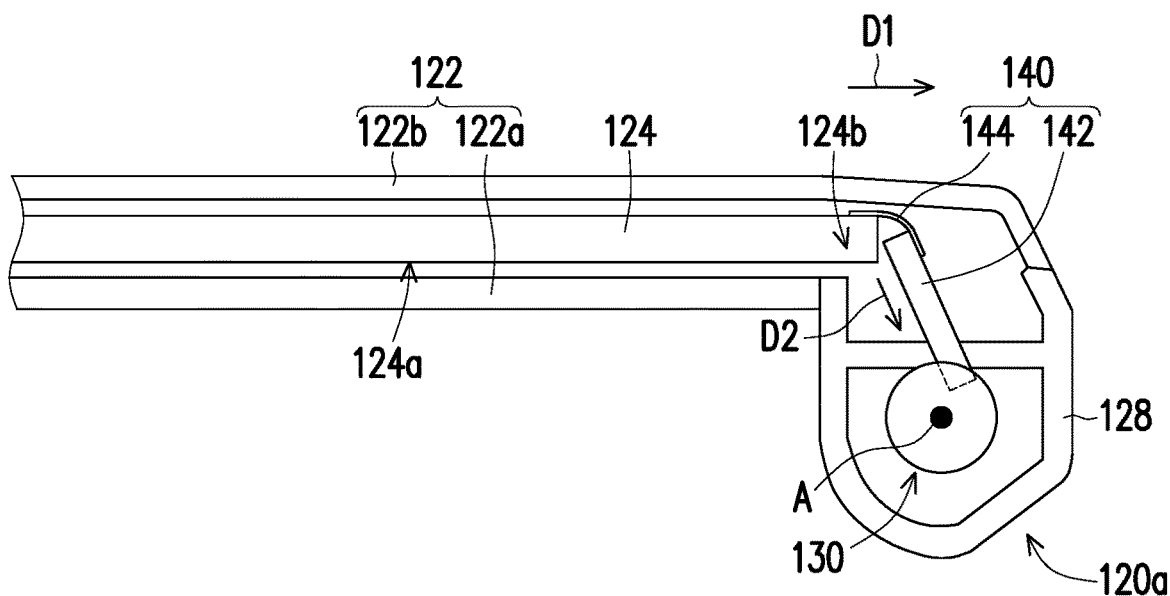
FIG. 5B is a partial cross-sectional view of an electronic device according to another embodiment of the disclosure.

FIG. 5A is a partial cross-sectional view of the electronic device in FIG. 1. Referring to FIG. 5A, specifically, the electronic assembly 140 in the present embodiment includes a control circuit board 142 and an FPC 144, and two ends of the FPC 144 are respectively connected to the control circuit board 142 and the display panel 124 of the second body 120. A region between the two ends of the FPC 144 is separated from the control circuit board 142. An extension length L1 of the FPC 144 from the display panel 124 of the second body 120 to the control circuit board 142 is less than or equal to an extension length L2 of the control circuit board 142 along a direction away from the FPC 144. Each side edge of the control circuit board 142 is a flat surface without gaps. The control circuit board 142 includes a top edge 142a and a bottom edge 142b, the top edge 142a is close to the display panel 124, and the bottom edge 142b is away from the display panel 124. The FPC 144 is connected to the display panel 124 from the control circuit board 142 through the top edge 142a. In addition, in some embodiments, the control circuit board 142 may, as shown in FIG. 5A, include a through hole H, and the FPC 144 does not penetrate the through hole H. The control circuit board 142 bends relative to the display panel 124 of the second body 120 through single bending of the FPC 144, so that the control circuit board 142 does not increase the overall size of the electronic device 100 in the direction D1 parallel to the display surface 124a of the display panel 124. For example, an angle between an extension direction D2 of the control circuit board 142 and the extension direction D1 of the display panel 124 may be 45 degrees to 100 degrees, to reduce the size of the electronic device 100 in the direction D1 without increasing a size of the electronic device 100 in the direction D2. The control circuit board 142 of the electronic assembly 140 is, for example, connected to the display panel 124 and serves as a display control panel of the display panel 124. In other embodiments, the control circuit board 142 may be a touch control board. The control circuit board 142 and the hinge 130 do not overlap in the axial direction A, as shown in FIG. 5A. However, the disclosure is not limited thereto. FIG. 5B is a partial cross-sectional view of an electronic device according to another embodiment of the disclosure, and the control circuit board 142 and the hinge 130 may overlap in the axial direction A, as shown in FIG. 5B. In other embodiments, the electronic assembly 140 may include an L-shaped circuit board that bends at an angle of 45 degrees to 100 degrees.

Figure 6:
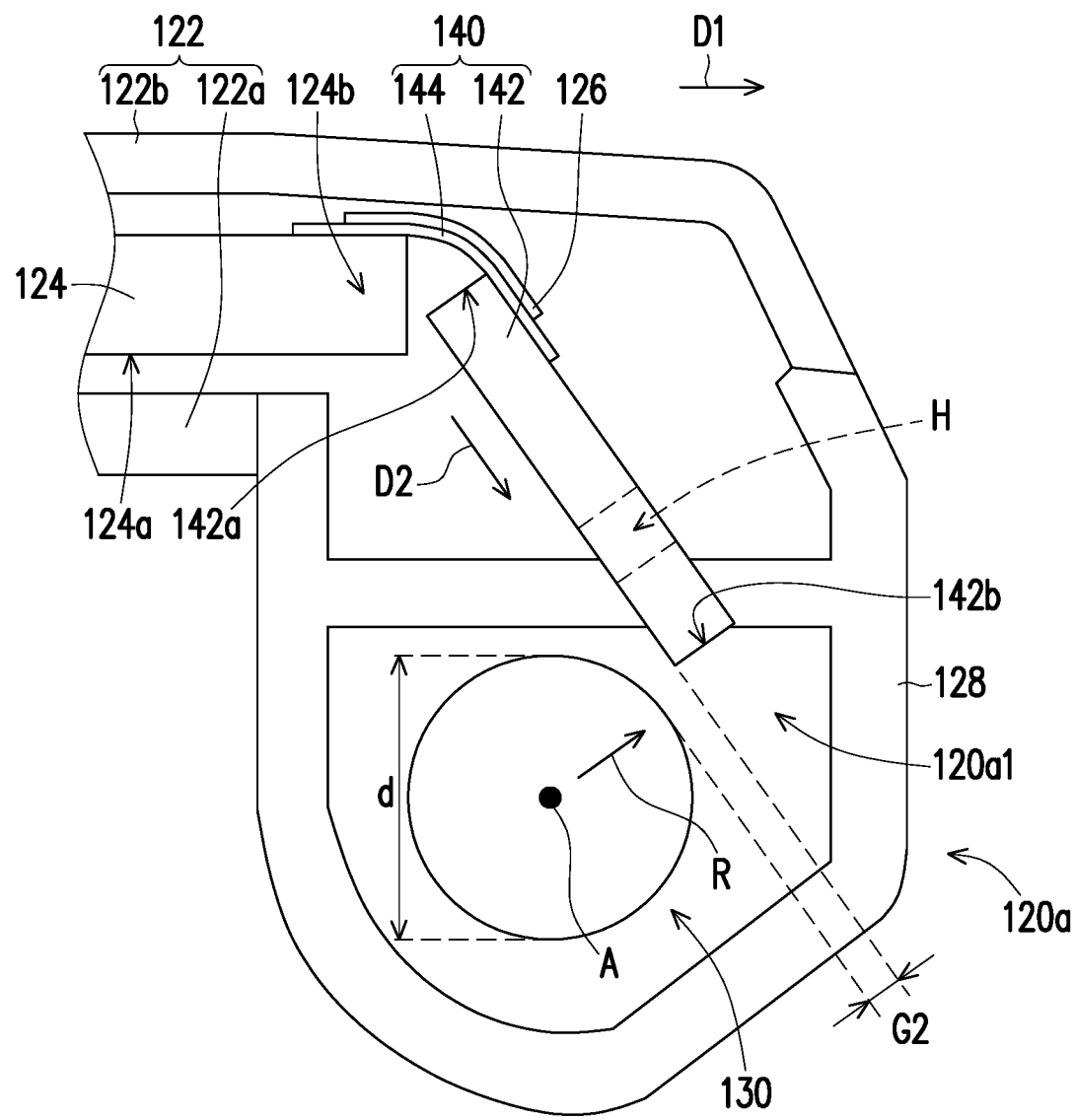
FIG. 6 is an enlarged partial view of the electronic device in FIG. 5A.

FIG. 6 is an enlarged partial view of the electronic device in FIG. 5A. As shown in FIG. 6, the second body 120 further includes a lock assembly 126, the lock assembly 126 is, for example, an L-shaped sheet metal member, and is connected to the display panel 124, and the control circuit board 142 of the electronic assembly 140 is locked to the lock assembly 126 for fixation, to prevent the electronic assembly 140 from producing unexpected displacement during rotation of the second body 120 relative to the first body 110. In addition, during shipment and delivery of the electronic device 100, the lock assembly 126 can protect the FPC 144 against line damage. The lock assembly 126 may be applied to the embodiment shown in FIG. 5B and any subsequent embodiment, and this is not limited in the disclosure. In addition, in other embodiments, the electronic assembly 140 may be engaged with or attached to the first body 110, the front frame 122a of the second body 120, the back cover 122b, or a hinge cover 128 described below, and this is not limited in the disclosure. Fixation of the electronic assembly 140 prevents the FPC 144 from repeatedly bending and easily shaking during use of the electronic device 100, thereby avoiding signal weakening or interruption, and increasing a service life of the display panel and/or the touch panel.

In the present embodiment, the electronic device 100 further includes a masking portion 120a, and the masking portion 120a includes a receiving groove 120a1, for receiving the hinge 130, so that the masking portion 120a at least partially masks the hinge 130. In other embodiments, the receiving groove 120a1 may be further configured to receive the control circuit board 142 and the FPC 144. Specifically, the second body 120 further includes a hinge cover 128, the hinge cover 128 is connected between the front frame 122a and the back cover 122b, and the hinge cover 128 constitutes the masking portion 120a. In addition, in the present embodiment, as shown in FIG. 6, an end 124b of the display panel 124 extends to the masking portion 120a and is located inside the receiving groove 120a1, so that the electronic assembly 140 connected to the end 124b of the display panel 124 easily extends into the masking portion 120a. Moreover, in the present embodiment, the hinge cover 128 and the front frame 122a are not of an integrated structure. Therefore, when needing to be in different colors due to design requirements, the hinge cover 128 and the front frame 122a may be respectively sprayed first and then assembled together, without needing to use a spray masking groove to achieve color separation, thereby simplifying the process. In addition, the hinge cover 128 and the front frame 122a are not in an integrated structure, and therefore, are easy to assembly and maintain. In other embodiments, the masking portion 120a may be constituted by part of the main housing 122 of the second body 120.

Referring to FIG. 6, a second gap G2 exists between the electronic assembly 140 and the hinge 130 in a radial direction R of the hinge 130. That is, the electronic assembly 140 and the hinge 130 are distant from each other in the radial direction R of the hinge 130, and therefore, the masking portion 120a correspondingly has a relatively large size and is easy to be assembled. In addition, because the masking portion 120a has a relatively large size, when the second body 120 is expanded to the first body 110 as shown in FIG. 2, the masking portion 120a may lift off the first body 110 from a table to improve comfort of a user when the first body 110 is being operated (for example, typing). For example, the second gap G2 is less than or equal to a diameter d (shown in FIG. 6) of the hinge 130. Specifically, the second gap G2 is less than or equal to 4 mm.

Figure 7:
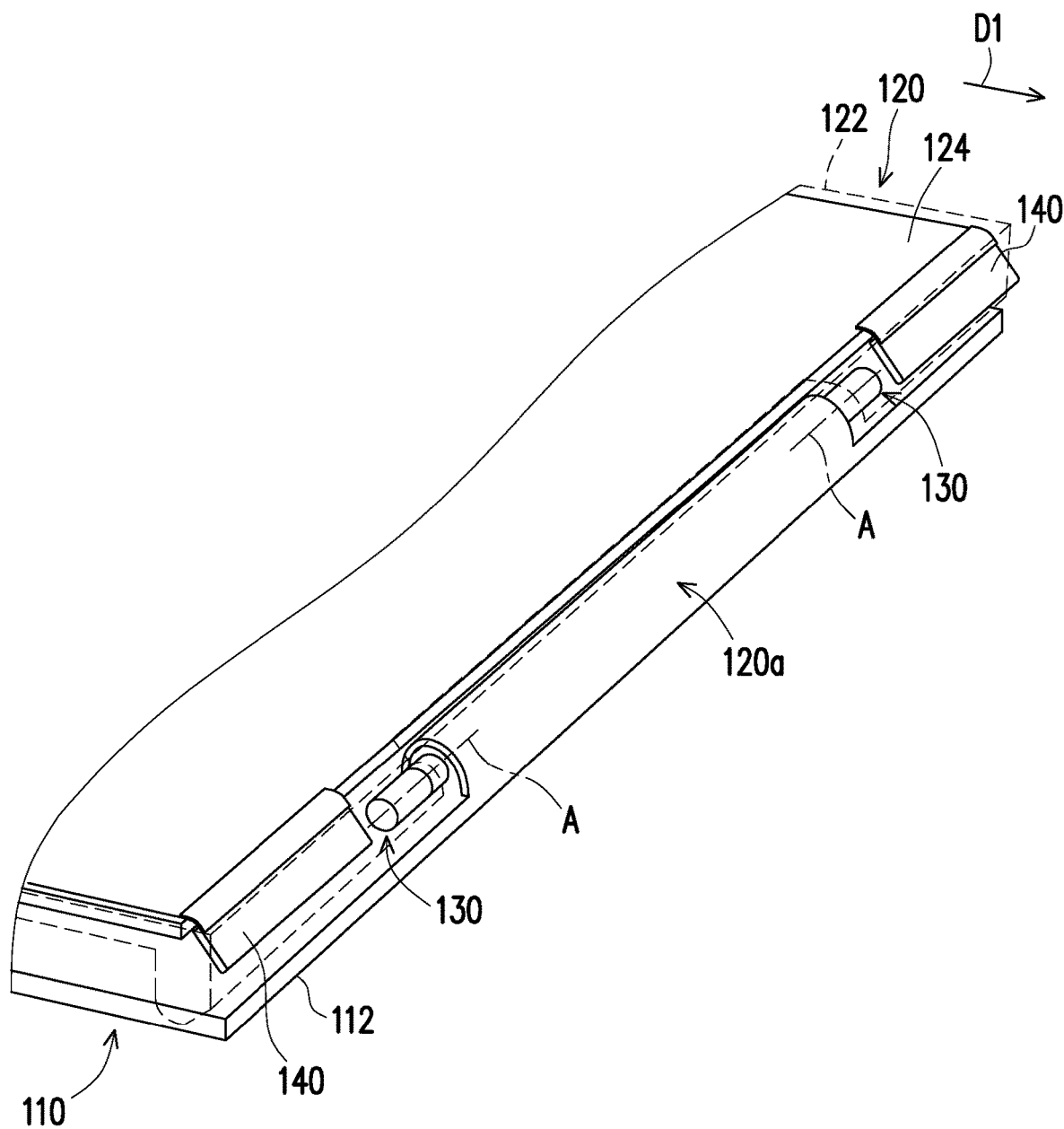
FIG. 7 is a three-dimensional view of some components of an electronic device according to another embodiment of the disclosure.
Figure 8A:
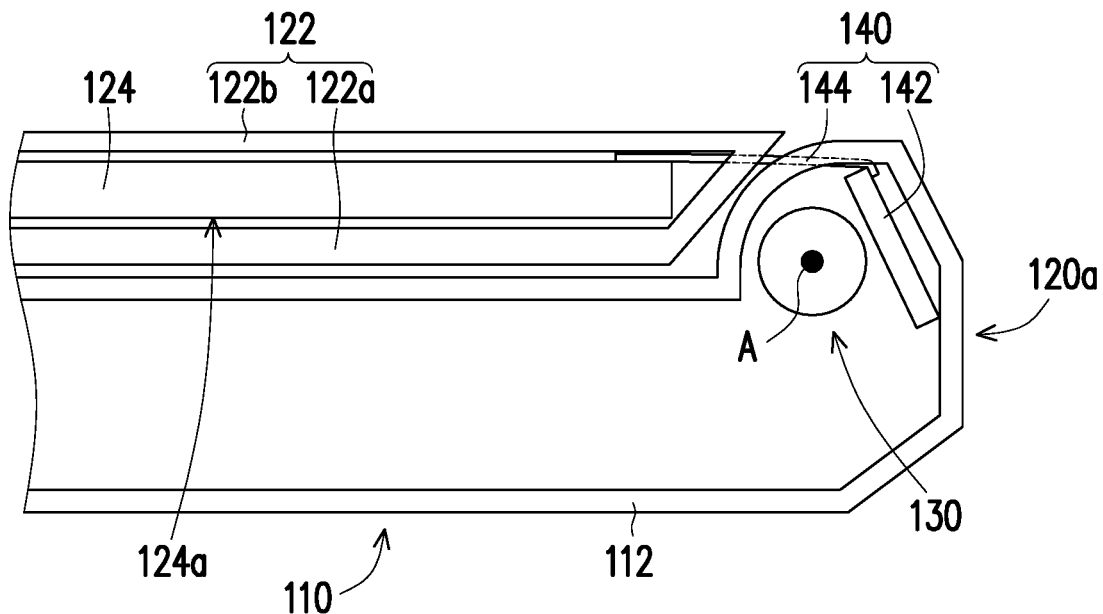
FIG. 8A is a partial cross-sectional view of the electronic device in FIG. 7.
Figure 8B:
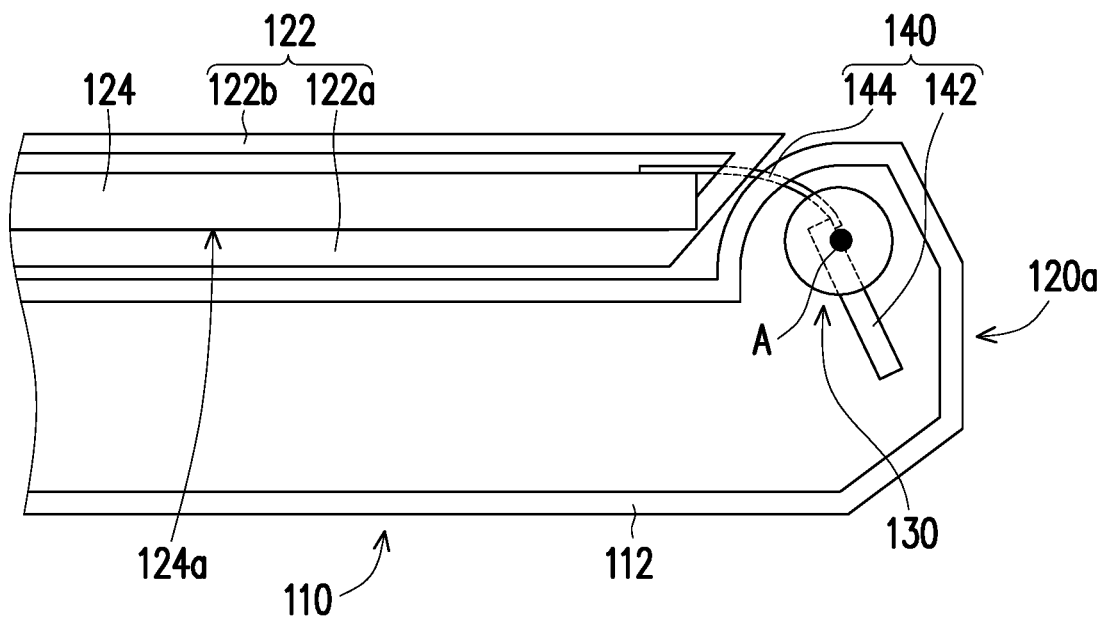
FIG. 8B is a partial cross-sectional view of an electronic device according to another embodiment of the disclosure.

FIG. 7 is a three-dimensional view of some components of an electronic device according to another embodiment of the disclosure. FIG. 8A is a partial cross-sectional view of the electronic device in FIG. 7. A difference between the embodiment shown in FIG. 7 and FIG. 8A and the embodiment shown in FIG. 3 and FIG. 5A lies in that, a partial structure of a main housing 112 of the first body 110 in FIG. 7 and FIG. 8A constitutes the masking portion 120a to mask the hinge 130, and therefore, no addition hinge cover needs to be disposed. The control circuit board 142 and the hinge 130 do not overlap in the axial direction A, as shown in FIG. 8A. However, the disclosure is not limited thereto. FIG. 8B is a partial cross-sectional view of an electronic device according to another embodiment of the disclosure, and the control circuit board 142 and the hinge 130 may overlap in the axial direction A, as shown in FIG. 8B.

Figure 9:
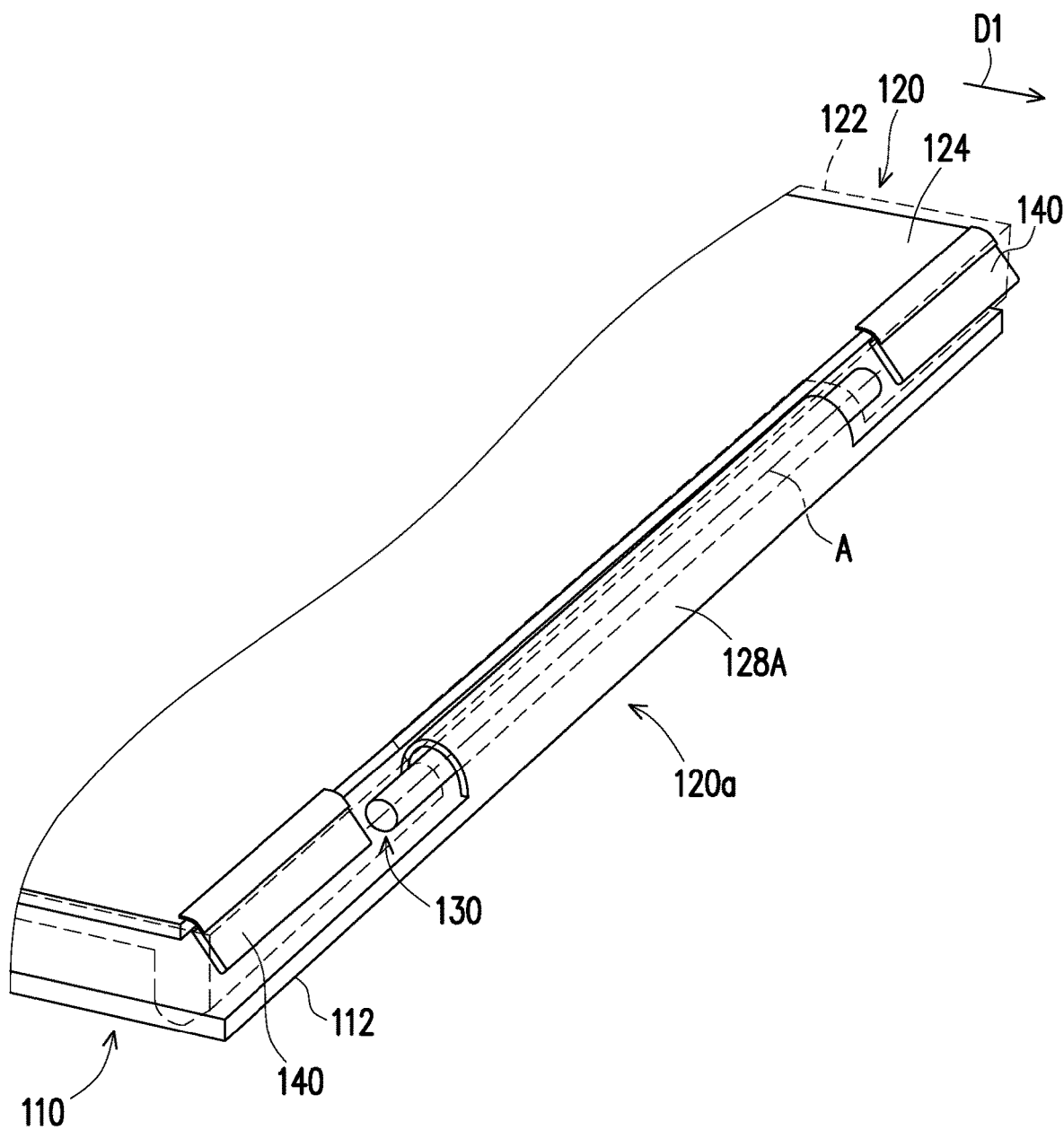
FIG. 9 is a three-dimensional view of some components of an electronic device according to another embodiment of the disclosure.
Figure 10A:
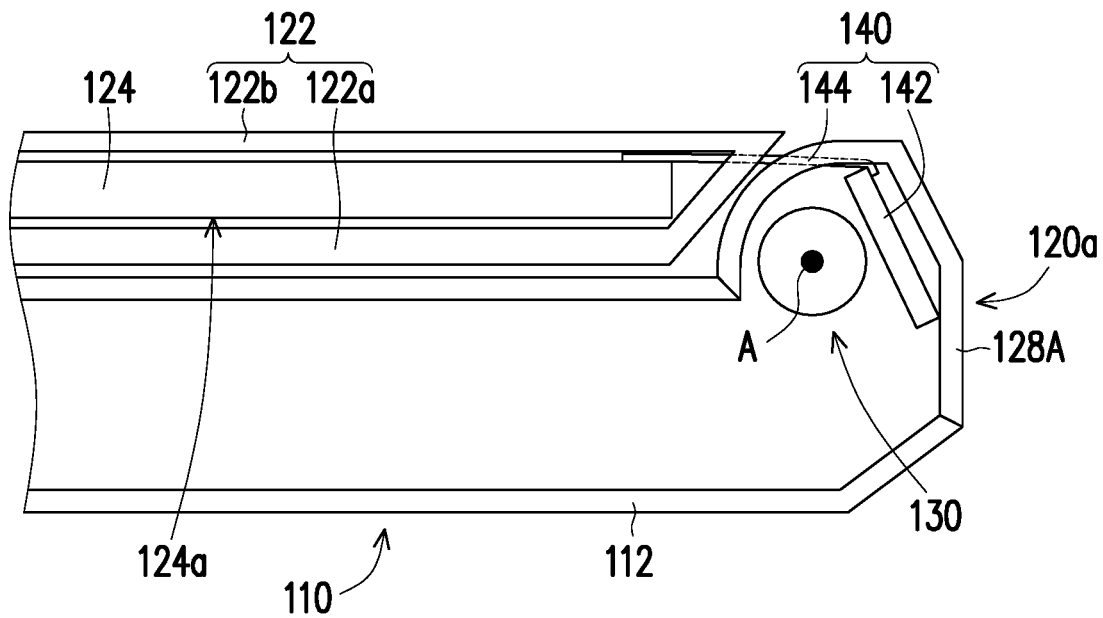
FIG. 10A is a partial cross-sectional view of the electronic device in FIG. 9.
Figure 10B:
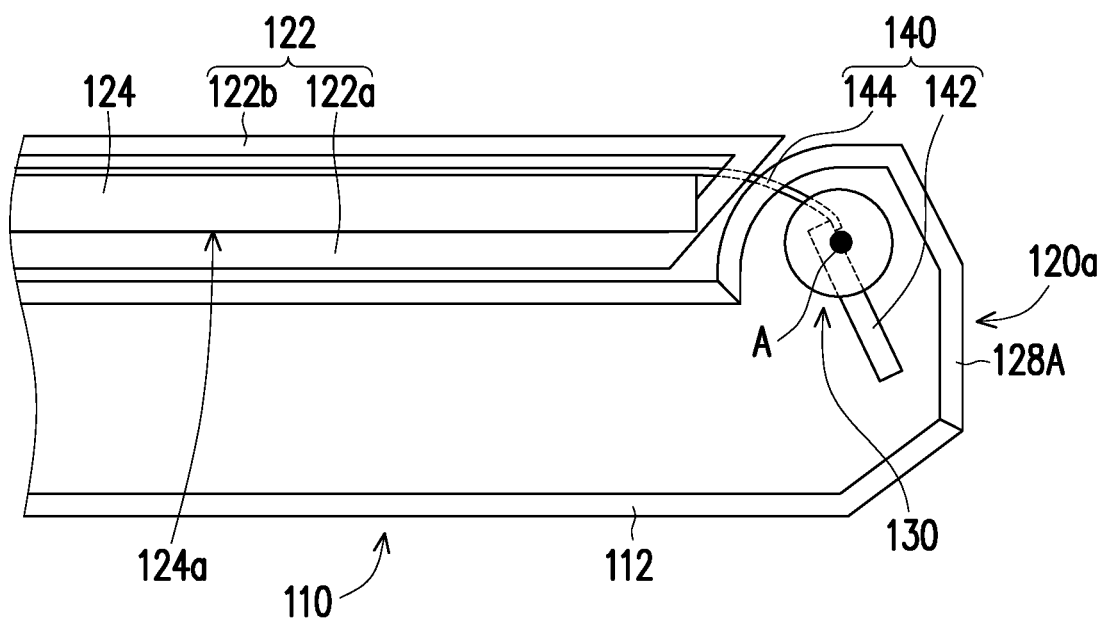
FIG. 10B is a partial cross-sectional view of an electronic device according to another embodiment of the disclosure.

FIG. 9 is a three-dimensional view of some components of an electronic device according to another embodiment of the disclosure. FIG. 10A is a partial cross-sectional view of the electronic device in FIG. 9. A difference between the embodiment shown in FIG. 9 and FIG. 10A and the embodiment shown in FIG. 7 and FIG. 8A lies in that, the first body 110 in FIG. 9 and FIG. 10A includes a hinge cover 128A connected to the main housing 112, and the hinge cover 128A constitutes the masking portion 120a to mask the hinge 130. In addition, the embodiment shown in FIG. 9 includes only one hinge 130, located between two electronic assemblies 140. The control circuit board 142 and the hinge 130 do not overlap in the axial direction A, as shown in FIG. 10A. However, the disclosure is not limited thereto. FIG. 10B is a partial cross-sectional view of an electronic device according to another embodiment of the disclosure, and the control circuit board 142 and the hinge 130 may overlap in the axial direction A, as shown in FIG. 8B.

Figure 11:
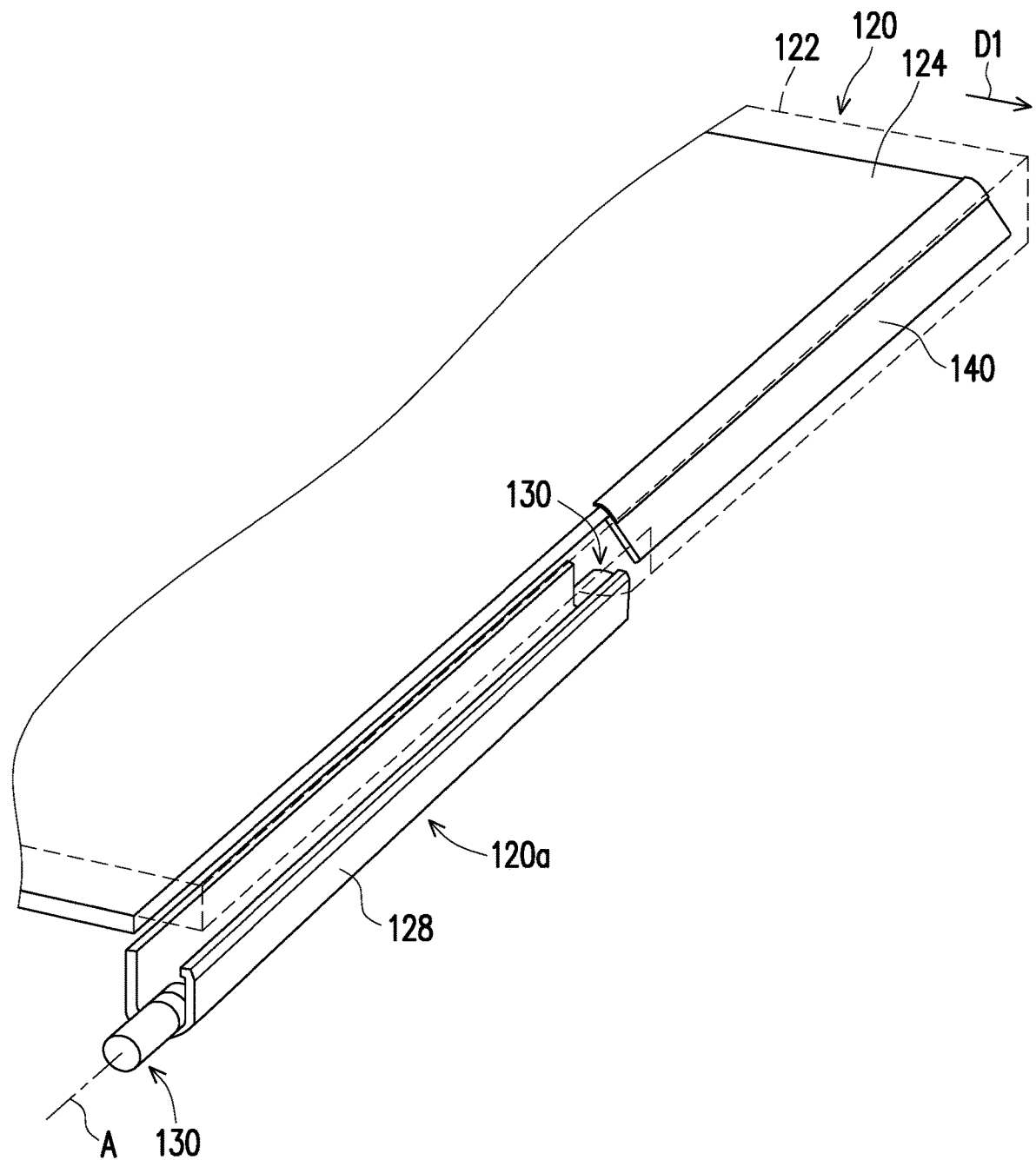
FIG. 11 is a three-dimensional view of some components of an electronic device according to another embodiment of the disclosure.

FIG. 11 is a three-dimensional view of some components of an electronic device according to another embodiment of the disclosure. A difference between the embodiment shown in FIG. 11 and the embodiment shown in FIG. 3 lies in that, the embodiment shown in FIG. 11 includes only one electronic assembly 140, and one hinge 130 is located between the electronic assembly 140 and the other hinge 130. The electronic assembly 140 and the hinge 130 shown in FIG. 11 may not overlap in the axial direction A, as shown in FIG. 5A. However, the disclosure is not limited thereto. The electronic assembly 140 and the hinge 130 shown in FIG. 11 may overlap in the axial direction A, as shown in FIG. 5B. In addition, the electronic assembly 140 may be alternatively located between the two hinges 130.

Figure 12:
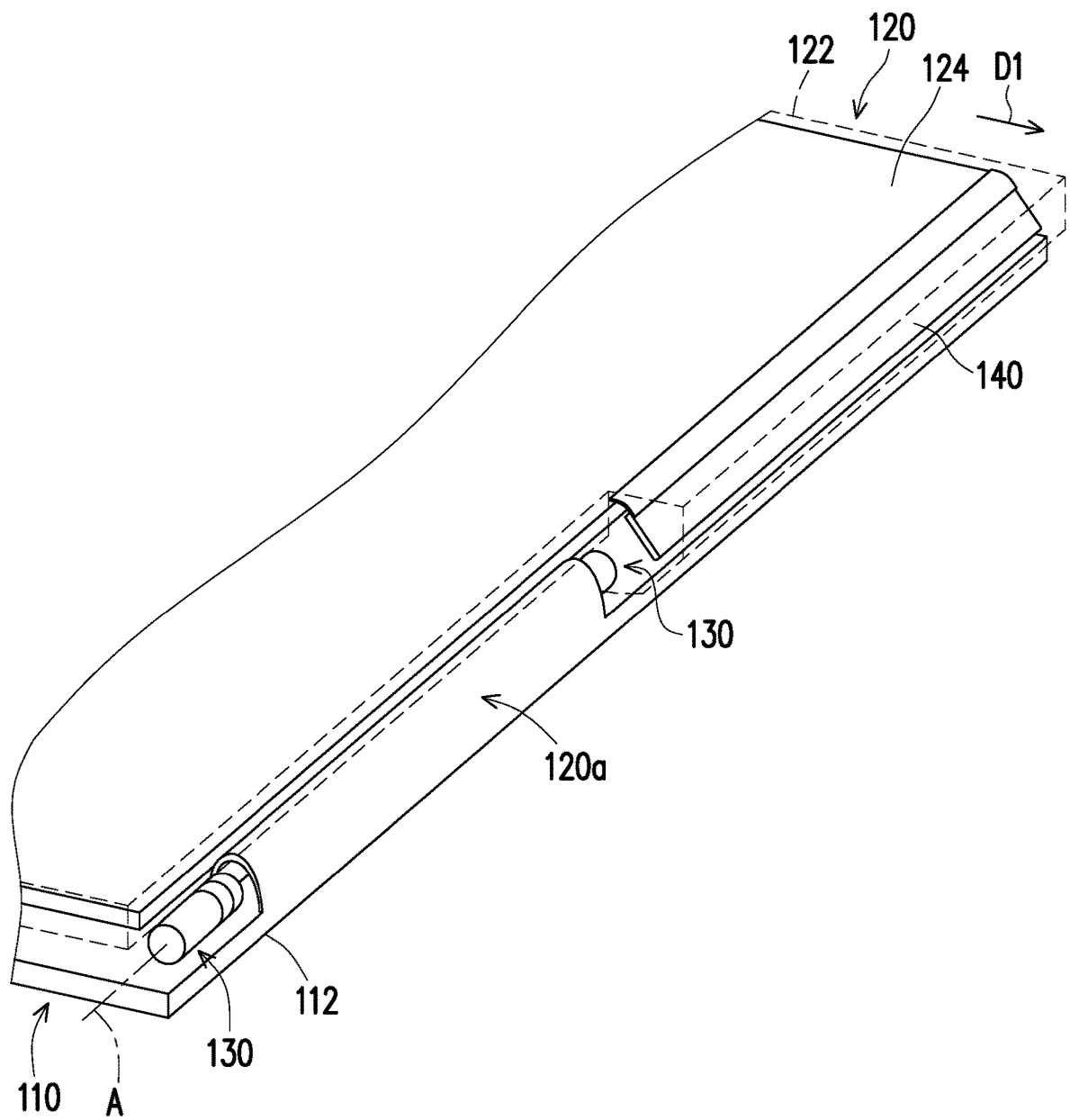
FIG. 12 is a three-dimensional view of some components of an electronic device according to another embodiment of the disclosure.

FIG. 12 is a three-dimensional view of some components of an electronic device according to another embodiment of the disclosure. A difference between the embodiment shown in FIG. 12 and the embodiment shown in FIG. 7 lies in that, the embodiment shown in FIG. 12 includes only one electronic assembly 140, and one hinge 130 is located between the electronic assembly 140 and the other hinge 130. The electronic assembly 140 and the hinge 130 shown in FIG. 12 may not overlap in the axial direction A, as shown in FIG. 8A. However, the disclosure is not limited thereto. The electronic assembly 140 and the hinge 130 shown in FIG. 12 may overlap in the axial direction A, as shown in FIG. 8B. In addition, the electronic assembly 140 may be alternatively located between the two hinges 130.

In other embodiments, the electronic assembly may be alternatively a button, an antenna, a speaker, a camera lens, a gesture sensor, or any other type of electronic assembly. This is not limited in the disclosure.

Based on the above, in the electronic device provided in one or more embodiments of the disclosure, the electronic assembly is disposed on the outside of the hinge and a gap (i.e., the first gap) exists between the electronic assembly and the hinge in the axial direction. In this way, the electronic assembly may smoothly bend relative to the second body without causing interference with the hinge, so that electronic assembly does not increase the overall size of the electronic device in the direction parallel to the display surface of the second body. In addition, a gap (i.e., the second gap) may further exist between the electronic assembly and the hinge in the radial direction, to make the electronic assembly and the hinge distant from each other in the radial direction, so that the masking portion correspondingly has a relatively large size and is easy to be assembled. In addition, when the second body is expanded from the first body, the masking portion lifts off the first body from a table to improve comfort of a user when the first body is being operated.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An electronic device, comprising:
a first body;
a second body;
at least one hinge, connected between the first body and the second body, wherein the first body and the second body are adapted to rotate relatively through the at least one hinge; and
at least one electronic assembly, connected to the second body, wherein a first gap exists between the at least one electronic assembly and the at least one hinge in an axial direction of the at least one hinge,
wherein the second body comprises a display panel,
wherein the at least one electronic assembly comprises a control circuit board and a flexible printed circuit, and two ends of the flexible printed circuit are respectively connected to the control circuit board and the display panel, and
wherein a total extension length of the flexible printed circuit from the display panel to the control circuit board is less than or equal to a total extension length of the control circuit board along a direction away from the flexible printed circuit.

2. The electronic device according to claim 1, wherein the first gap is less than or equal to one half a length of the at least one hinge along the axial direction.

3. The electronic device according to claim 1, wherein the first gap is less than or equal to 2 mm.

4. The electronic device according to claim 1, wherein a quantity of the at least one hinge is one, a quantity of the at least one electronic assembly is two, and the hinge is located between the two electronic assemblies.

5. The electronic device according to claim 1, wherein a quantity of the at least one hinge is two, a quantity of the at least one electronic assembly is one, and one of the two hinges is located between the electronic assembly and the other hinge.

6. The electronic device according to claim 1, wherein a quantity of the at least one hinge is two, a quantity of the at least one electronic assembly is one, and the electronic assembly is located between the two hinges.

7. The electronic device according to claim 1, wherein a quantity of the at least one hinge is two, a quantity of the at least one electronic assembly is two, and the two hinges are located between the two electronic assemblies.

8. The electronic device according to claim 1, wherein the at least one electronic assembly and the at least one hinge do not overlap in the axial direction.

9. The electronic device according to claim 1, wherein a second gap exists between the at least one electronic assembly and the at least one hinge in a radial direction of the at least one hinge.

10. The electronic device according to claim 1, wherein an angle between an extension direction of the control circuit board and an extension direction of the display panel is 45 degrees to 100 degrees.

11. The electronic device according to claim 1, wherein the second body comprises a lock assembly connected to the display panel, and the control circuit board is locked to the lock assembly.

12. The electronic device according to claim 1, wherein a region between the two ends of the flexible printed circuit is separated from the control circuit board.

13. The electronic device according to claim 1, wherein the control circuit board bends relative to the display panel through single bending of the flexible printed circuit.

14. The electronic device according to claim 1, wherein the control circuit board comprises a top edge and a bottom edge, the top edge is close to the display panel, and the bottom edge is away from the display panel.

15. The electronic device according to claim 14, wherein the flexible printed circuit is connected to the display panel from the control circuit board through the top edge.

16. The electronic device according to claim 1, wherein each side edge of the control circuit board is a flat surface.

17. The electronic device according to claim 1, wherein the control circuit board comprises a through hole, and the flexible printed circuit does not penetrate the through hole.

18. The electronic device according to claim 1, wherein the second body comprises a back cover and a front frame, and the display panel is disposed between the back cover and the front frame and is exposed by the front frame.

19. The electronic device according to claim 18, wherein the control circuit board is secured to the front frame.

20. The electronic device according to claim 19, wherein the front frame comprises a main housing and a hinge cover, and the hinge cover is connected to the main housing.

21. The electronic device according to claim 20, wherein the control circuit board is attached to or engaged with the main housing.

22. The electronic device according to claim 20, wherein the control circuit board is attached to or engaged with the hinge cover.

23. The electronic device according to claim 1, wherein the second body comprises a receiving groove configured to receive the control circuit board, the flexible printed circuit, and the at least one hinge.

24. The electronic device according to claim 23, wherein an end of the display panel extends into the receiving groove.

25. The electronic device according to claim 1, wherein the first body is a logic unit or a stand.

26. The electronic device according to claim 1, wherein the at least one electronic assembly comprises at least one of a button, an antenna, a speaker, a camera lens, and a gesture sensor.

27. An electronic device, comprising:
a first body;
a second body;
at least one hinge, connected between the first body and the second body, wherein the first body and the second body are adapted to rotate relatively through the at least one hinge; and
at least one electronic assembly, connected to the second body, wherein a second gap exists between the at least one electronic assembly and the at least one hinge in an axial direction of the at least one hinge,
wherein the second body comprises a display panel,
wherein the at least one electronic assembly comprises a control circuit board and a flexible printed circuit, and two ends of the flexible printed circuit are respectively connected to the control circuit board and the display panel, and
wherein a total extension length of the flexible printed circuit from the display panel to the control circuit board is less than or equal to a total extension length of the control circuit board along a direction away from the flexible printed circuit.

28. The electronic device according to claim 27, wherein the second gap is less than or equal to a diameter of the at least one hinge.

29. The electronic device according to claim 27, wherein the second gap is less than or equal to 4 mm.

30. The electronic device according to claim 1, wherein a distance between the control circuit board and the at least one hinge is less than a distance between the display panel and the at least one hinge.

\* \* \* \* \*